United States Patent [19]

Anthony

[11] Patent Number: 4,549,912
[45] Date of Patent: Oct. 29, 1985

[54] ANODE AND CATHODE CONNECTIONS FOR THE PRACTICE OF ELECTROMIGRATION

[75] Inventor: Thomas R. Anthony, Schenectady, N.Y.

[73] Assignee: General Electric Company, Schenectady, N.Y.

[21] Appl. No.: 449,347

[22] Filed: Dec. 13, 1982

Related U.S. Application Data

[62] Division of Ser. No. 272,801, Jun. 11, 1981, Pat. No. 4,381,598.

[51] Int. Cl.⁴ .......................................... H01L 21/28
[52] U.S. Cl. .................................... 148/33.1; 29/584; 29/585; 29/590; 148/33.3; 148/33.4; 148/33.6; 156/602; 204/130; 204/140; 204/292; 204/294; 428/620
[58] Field of Search .............. 204/130, 140, 294, 292; 428/620; 148/171, 33.1, 33.3, 33.4, 33.6; 29/584, 585, 590; 156/602

[56] References Cited

U.S. PATENT DOCUMENTS

| | | | |
|---|---|---|---|
| 2,813,048 | 11/1957 | Pfann | 75/65 ZM |
| 3,378,409 | 4/1968 | Hurle et al. | 148/171 X |
| 3,909,319 | 9/1975 | Fujiwara et al. | 148/187 |
| 3,993,511 | 11/1976 | Daniele | 148/172 |
| 4,040,171 | 8/1977 | Cline et al. | 29/575 X |
| 4,130,473 | 12/1978 | Eddleman | 204/294 X |
| 4,133,705 | 1/1979 | André | 148/171 |
| 4,265,727 | 5/1981 | Beckley | 204/294 X |
| 4,326,938 | 4/1982 | Gupta et al. | 204/294 X |
| 4,377,423 | 3/1983 | Anthony | 148/171 |
| 4,381,598 | 5/1983 | Anthony | 148/171 X |

Primary Examiner—G. Ozaki
Attorney, Agent, or Firm—Paul E. Rochford; James C. Davis, Jr.; James Magee, Jr.

[57] ABSTRACT

In the electromigration process, liquid metal inclusions are migrated into or through bodies of semiconductor material by an electrical potential gradient driving force. The method of this invention provides anode and cathode connections generally useful in the practice of electromigration and connections which are especially useful in circumventing the adverse effects of several types of rectifying junctions encountered in the practice of electromigration.

22 Claims, 18 Drawing Figures

ANODE AND CATHODE CONNECTIONS FOR THE PRACTICE OF ELECTROMIGRATION

This application is a division of application Ser. No. 272,801, filed 6/11/81, now U.S. Pat. No. 4,381,598.

CROSS-REFERENCE

In U.S. patent application Ser. No. 221,142 filed Dec. 29, 1980 and now abandoned, and assigned to the same assignee as the instant application, a method is disclosed and claimed for the making of P-N junctions in semiconductor materials by electromigration. A continuation-in-part application Ser. No. 372,857 was filed Apr. 28, 1982 and issued in March, 1983 as Pat. No. 4,377,423. The subject matter of the foregoing application is incorporated herein by reference.

FIELD OF THE INVENTION

This invention relates generally to the making of P-N junctions in semiconductor materials by the electromigration process. More particularly, the method of this invention provides anode and cathode connections generally useful in the practice of electromigration and connections which are especially useful in circumventing the adverse effects of several types of rectifying junctions encountered in the practice of electromigration.

BACKGROUND OF THE INVENTION

The process of migrating a liquid metal inclusion through a solid using a thermal gradient, known as Temperature Gradient Zone Melting (TGZM), was invented by Pfann and is described, for example, in his U.S. Pat. No. 2,813,048 issued Nov. 12, 1957. In Pfann's process either sheets or wires of a suitable metallic liquid were moved through a semiconductor material by a thermal gradient. Doped liquid-epitaxial recrystallized material was left behind as the liquid wire migration progressed. Subsequently, several investigators found that the planar liquid zone was unstable and that droplets of liquid broke away from the zone and were trapped in the recrystallized material. For that reason, material produced by Pfann's TGZM process was not suitable for the manufacture of semiconductor devices.

The TGZM process has, however, recently been developed by Anthony and Cline into a viable commercial process for producing P-N junction structures in semiconductors such as, for example, the isolation grids described in their U.S. Pat. Nos. 3,979,230 and 3,998,662 and the diodes of their U.S. Pat. Nos. 3,899,361 and 3,901,736, the entirety of which are herein incorporated by reference.

Briefly, in the commercial version of the TGZM process, semiconductor wafers are placed between an array of air-cooled high-temperature quartz lamps and a water-cooled heat sink. Infrared radiation from the lamps is absorbed and converted into heat by the wafer surface facing the lamps. This heat then passes through the wafer and is re-radiated to the heat sink by the opposing wafer surface. The thermal gradient that drives the TGZM process is generated by the heat flow through the wafer. Typical apparatus for the commercial practice of the TGZM process is described in U.S. Pat. Nos. 4,091,257 and 4,221,956; the entirety of which are also incorporated herein by reference.

SUMMARY OF THE INVENTION

In the electromigration process, liquid metal inclusions are migrated into or through bodies of semiconductor material by an electrical potential gradient driving force. The method of this invention provides anode and cathode connections generally useful in the practice of electromigration and connections which are especially useful in circumventing the adverse effects of several types of rectifying junctions encountered in the practice of electromigration.

The invention has several embodiments, but the connections of the invention may generally be classified in terms of those particularly useful for electromigration at low current densities and those particularly useful at high current densities. The connection for use at low current densities is made by providing a body of single crystal semiconductor material suitable for the practice of electromigration, forming a layer of an insulating material on a preselected major surface of the body, opening at least one window in the layer of insulating material to expose an area of the major surface beneath the layer of insulating material, establishing a deposit of the metal to be electromigrated in the window in contact with the major surface and applying a layer of a conducting material over the layer of insulating material in contact with the deposit.

A similar connection, having a non-migrating refractory metal deposit in the window opening, may be made in the opposite major surface of the body. The refractory deposit may be placed opposite to the deposit to be electromigrated or may be placed so that it is not opposite to the deposit to be electromigrated thereby causing electromigration to occur along a path which is at an angle to the perpendicular path between the major surfaces.

The connection for electromigration at low current densities, therefore, is characterized by a layer of insulating material which is contiguous with and overlies a preselected major surface of a selected body of semiconductor material and has at least one window in which there is a deposit of a metal in contact with the major surface of the body and including a layer of a conducting material which is contiguous with and overlies the layer of insulating material and is in contact with the deposit. The metal deposit will at least be the metal to be electromigrated and if two connections are made to opposed major surfaces of the body one deposit will be the metal to be electromigrated and the other deposit will be the non-migrating refractory metal.

The connection for use at high current densities is made by providing a body of single crystal semiconductor material suitable for the practice of electromigration, forming at least one deposit of the metal to be electromigrated on a preselected major surface of the body, applying a layer of a refractory metal over the preselected major surface and the deposit, and applying a second layer of a conducting material over the first layer.

In the high current density electromigration mode, the connection on the opposed major surface of the body is made by applying a first layer of a refractory metal over the opposed major surface and applying a second layer of a conducting material over the first layer of a refractory metal.

The connections for high current density electromigration thus are either characterized by a first layer of a refractory metal overlying and contiguous with a preselected major surface of a preselected body of semiconductor material and also overlying at least one deposit of the metal to be electromigrated and a second layer of a conducting material overlying and contiguous with the first layer or by a first layer of a refractory metal overlying and contiguous with a preselected major surface of a preselected body of semiconductor material and a second layer of a conducting material overlying and contiguous with the first layer.

BRIEF DESCRIPTION OF THE DRAWINGS

The invention is more clearly understood from the following description taken in conjunction with the accompanying drawings wherein.

DETAILED DESCRIPTION OF THE INVENTION

Figure 1:
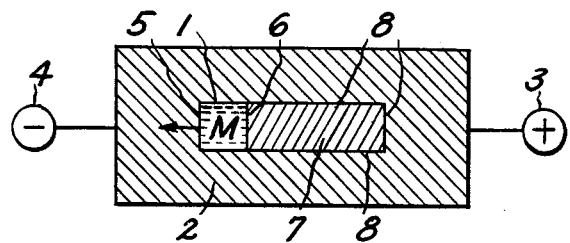
FIG. 1 is a schematic representation in cross-section of a liquid metal inclusion electromigrating within a body of semiconductor material in response to an applied electrical potential gradient driving force.

With reference to FIG. 1, it has been discovered, as disclosed in the above-reference Ser. No. 221,142 application, that a metal-rich liquid zone, i.e., a liquid metal inclusion, 1 in a body 2 of semiconductor material through which a direct (DC) electric current is passing, will migrate along the lines of current flow either toward anode 3 or cathode 4. The motion of liquid metal inclusion 1, as indicated by the arrow in FIG. 1 and subsequent Figures, is caused by a flux of dissolved semiconductor atoms across inclusion 1 induced by the electric current passing through liquid inclusion 1. To feed this flux of semiconductor atoms, atoms of the semiconductor material of body 2 dissolve into inclusion 1 at forward interface 5 while dissolved atoms are deposited at rear interface 6.

For the purposes of this invention, the flow of DC current is from cathode 4 to anode 3; thus the direction, i.e., polarity, of the electrical potential gradient through or across body 2 will also be from cathode 4 to anode 3. Inclusion 1, will preferably be situated to lie along the direction, or path, of the electrical potential gradient and will electromigrate in response to that gradient substantially along that path either toward cathode 4 or anode 3.

In the recrystallized semiconductor trail 7 behind electromigrating inclusion 1, trace amounts of a dopant, i.e., the metal or metallic alloy comprising inclusion 1, are deposited up to the solid solubility limit of the dopant in the semiconductor material of body 2. If the metal making up inclusion 1 is an electrically active dopant for the semiconductor material of body 2, then deposited semiconductor trail 7 will be doped either N-type or P-type depending on the valence state and concentration of the dopant. By electromigrating of a P-type liquid metal inclusion 1 through a body 2 of an N-type semiconductor material or an N-type liquid metal inclusion 1 through a body 2 of a P-type semiconductor material, P-N junctions 8 are formed in body 2.

Figure 2:
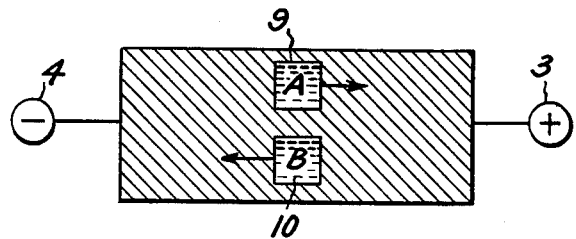
FIG. 2 is a schematic representation in cross-section of two liquid metal inclusions of different composition electromigrating in opposite directions in the same body of semiconductor material in response to the same applied electrical potential gradient driving force.

It was discovered in the course of the making of the invention described in more detail in the referenced Ser. No. 221,142 application that not all liquid metal inclusions electromigrate in the same direction in a given semiconductor material in response to a given electrical potential gradient. That discovery is shown schematically in FIG. 2 wherein a liquid metal inclusion 9 of metal A with a work function greater than 4.55 electron volts (eV) electromigrates toward anode 3 while a liquid metal inclusion 10 of metal B with a work function less than 4.55 eV simultaneously electromigrates toward cathode 4 in silicon. As was further shown in the Ser. No. 221,142 application, the electromigration direction of an alloy liquid metal inclusion is also a function of the work function of the alloy and the semiconductor material in which the alloy inclusion migrates.

During the making of the Ser. No. 221,142 invention, three phenomena which could influence the electrical potential gradient driving force of the electromigration process were discovered. They are the formation of rectifying junctions, current funneling into the liquid metal inclusion and current funneling into the doped trail.

The formation of rectifying junctions, which is one subject of the instant invention, is dependent upon temperature and the type of conductivity, i.e., P-type, N-type or intrinsic, exhibited by both the material of the semiconductor body in which the inclusion is electromigrating and the material of the recrystallized trail. At sufficiently high temperatures, both the material of the semiconductor body and the deposited semiconductor trail will have an intrinsic-type conductivity. As the temperature is lowered, a first transition temperature will be reached at which temperature the semiconductor trail will become extrinsic, i.e., P-type or N-type, while the material of the semiconductor body remains intrinsic. The trail becomes extrinsic before the material of the body because it either has dopant atoms or has a higher concentration of dopant atoms compared to the material of the body.

Figure 3:
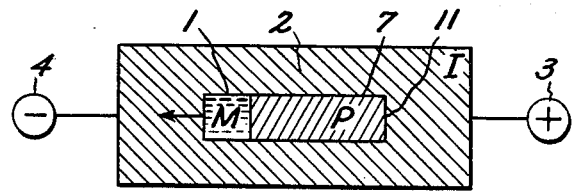
FIG. 3 is a schematic representation in cross-section of a liquid metal inclusion electromigrating within a body of intrinsic semiconductor material and forming a trail of P-type semiconductor material.
Figure 4:
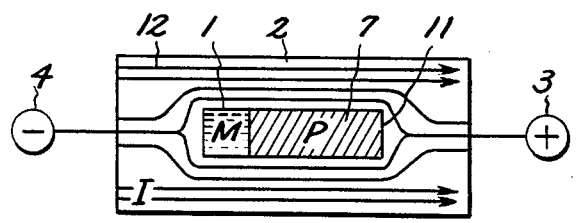
FIG. 4 is a schematic representation in cross-section of current diversion away from the electromigrating liquid metal inclusion of FIG. 3 due to the formation of a rectifying junction between the trail and the semiconductor material of the body.

The formation of one type of rectifying junction is shown schematically in FIGS. 3 and 4 wherein liquid metal inclusion 1 is electromigrating toward cathode 4 leaving a P-type recrystallized trail while the semiconductor material of body 2 reamins intrinsic. The junction 11 between the trail 7 and the semiconductor material of body 2 will be recognized by those familiar with the semiconductor arts as being reverse biased. The rectifying junction can cause applied current 12 to be diverted around inclusion 1, as shown schematically in FIG. 4, thus causing loss of the electrical potential driving force and, ultimately, cessation of electromigration.

Figure 5:
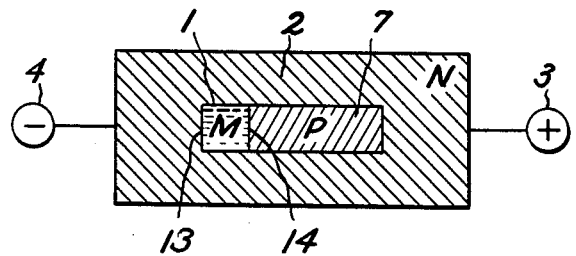
FIG. 5 is a schematic representation in cross-section of a liquid metal inclusion electromigrating within a body of N-type semiconductor material and forming a trail of P-type semiconductor material.

As the temperature decreases even further, the conductivity type of the semiconductor material of body 2 will change from intrinsic to extrinsic at a second transition temperature. Thus in FIG. 5, trail 7 remains of P-type conductivity and the semiconductor material of body 2 changes from intrinsic to N-type conductivity resulting in reverse biased rectifying junctions in the form of metal-semiconductor, i.e., Schottky type, junctions at the interface 13 between migrating inclusion 1 and the semiconductor material of body 2 and interface 14 between migrating inclusion 1 and trail 7.

As disclosed in the above-cited Ser. No. 221,142 application, a number of distinct potential cases of reverse biased junctions involving the electromigration of liquid metal inclusions in intrinsic, P-type, and N-type semiconductor crystals have been identified. In six of those cases the rectifying junctions can be overcome and the electromigration temperature range can be extended by making anode and cathode connections directly to trail 7 as disclosed and claimed herein. The cases, eighteen in all, are set forth in Table I, below, and those cases for which the connections of this invention are effective in negating the rectifying junctions between trail 7 and body 2 are denoted by an asterisk (*).

The only way to circumvent rectifying junctions existing between migrating inclusion 1 and the semiconductor material of body 2 or between migrating inclusion 1 and trail 7 is to raise the electromigration temperature to the temperature at which the conductivity type of both trail 7 and semiconductor material 2 becomes intrinsic. For both recrystallized trail 7 and body 2 to be intrinsic the temperature must be high enough that the intrinsic carrier concentration exceeds the extrinsic carrier concentration generated by the dopant impurities. Thus, electromigration in these cases is limited to a restricted range bordered at the upper end by the melting point of the semiconductor material of body 2 and at the lower end by the intrinsic-extrinsic transition temperature of recrystallized trail 7 and/or the semiconductor material of body 2. The practice of electromigration at such high temperatures has several detrimental aspects, however, especially the tendency for the impurity atoms to diffuse into the semiconductor body 2 thereby decreasing the sharpness of the junctions produced.

Electromigration proceeds at speeds similar to those found in thermomigration at relatively low current levels on the order of about 5 amps/cm$^2$ when both processes are carried out at the same temperature. With these low current densities and typical resistivities for the material of body 2 and trail 7, Joule heating is not a serious source of thermal stresses and strains.

TABLE

RECTIFYING JUNCTIONS ENCOUNTERED IN THE PRACTICE OF ELECTROMIGRATION

| CASE | DIRECTION OF INCLUSION MIGRATION | CONDUCTIVITY TYPE BODY | CONDUCTIVITY TYPE TRAIL | LOCATION OF RECTIFYING JUNCTION |
|---|---|---|---|---|
| 1 | CATHODE | I | I | NONE |
| 2 | ANODE | I | I | NONE |
| 3* | ANODE | I | N | TRAIL/BODY |
| 4 | ANODE | I | P | DROPLET/TRAIL |
| 5 | ANODE | N | I | DROPLET/BODY |
| 6* | ANODE | P | I | TRAIL BODY |
| 7 | ANODE | N | P | DROPLET/BODY DROPLET/TRAIL |
| 8 | ANODE | N | N | DROPLET/BODY |
| 9* | ANODE | P | N | TRAIL/BODY |
| 10 | ANODE | P | P | DROPLET/TRAIL |
| 11 | CATHODE | I | N | DROPLET/TRAIL |
| 12* | CATHODE | I | P | TRAIL/BODY |
| 13* | CATHODE | N | I | TRAIL/BODY |
| 14 | CATHODE | P | I | DROPLET/BODY |
| 15* | CATHODE | N | P | TRAIL/BODY |
| 16 | CATHODE | N | N | DROPLET/TRAIL |
| 17 | CATHODE | P | N | DROPLET/BODY DROPLET/TRAIL |
| 18 | CATHODE | P | P | DROPLET/BODY |

KEY:
I = Intrinsic, N = N-type, P = P-type
* = may be overcome by use of special anode and cathode connections of this invention This situation allows use of a nonuniform current distribution that concentrates the current to electromigrating liquid metal inclusions 1. Such current concentration reduces the total current required and adds a degree of freedom to the ability to direct an electromigrating droplet in a particular direction.

Figure 6A:
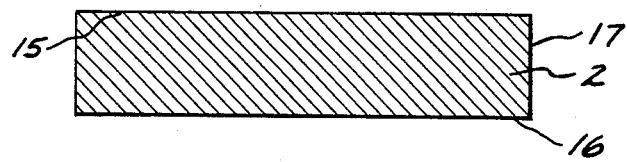
FIGS. 6A through 6E show in schematic cross-section the making of a first anode or cathode connection, particularly useful in electromigrating liquid metal inclusions at low current densities, on the first major surface of a body of semiconductor material.

With reference to FIGS. 6A through 6E, there is shown a typical sequence in the making of connections particularly useful in electromigrating liquid metal inclusions at low current densities. In FIG. 6A, body 2 is a single crystal of semiconducting material which has first (or top) 15 and second (or bottom) 16 major opposed substantially parallel major surfaces and an outer peripheral edge area 17 interconnecting major surfaces 15 and 16. Typically, body 2 is in the form of a wafer two to three inches in diameter and 12 mils in thickness.

The semiconducting material of body 2 may be selected from those which are known by the practitioners of the art of the construction of semiconductor or microelectronic devices. Suitable materials include, for example, silicon, silicon carbide, germanium, selenium, compounds of a group III element and a group V element (e.g., gallium arsenide), compounds of a group II and a group VI element (e.g., cadmium telluride). Body 2 may have a first preselected concentration of impurity atoms, i.e., dopant, therein to impart to body 2 a conductivity type and/or resistivity different from that of undoped semiconductor material.

Body 2 has a preselected crystallographic relationship between the plane of at least one of major surfaces 15 and 16 and the crystallographic direction parallel to the perpendicularly measured distance between major surfaces 15 and 16, i.e., the thickness of body 2. The methodology of the selection of body 2 to obtain the proper crystallographic relationships for body 2 vis-a-vis the type and shape of the metal-rich liquid zones to be electromigrated are set forth, for example, in the above-cited and incorporated U.S. Pat. Nos. 3,899,361; 3,901,736; 3,979,230; and 3,998,662.

Figure 6B:
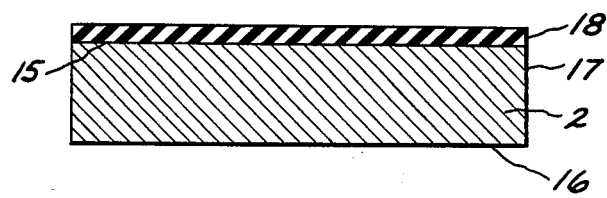

In FIG. 6B there is shown body 2 of FIG. 6A following application of layer 18 of an insulating material over surface 15. If the planes of surfaces 15 and 16 both have the required crystallographic relationship with the crystallographic direction parallel to the perpendicularly measured distance between surfaces 15 and 16, then the practice of the invention may begin from either surface 15 or 16. Suitable materials for layer 18 include the oxide of the semiconductor material of body 2 (e.g., silicon dioxide), a nitride of the semiconductor material of body 2 (e.g., silicon nitride), and, for electromigration at lower temperatures (e.g., less than about 500° C.), a polyimide copolymer film. Typically, the thickness of layer 18 will range from about 0.5 micron in thickness to about 5 microns in thickness.

Figure 6C:
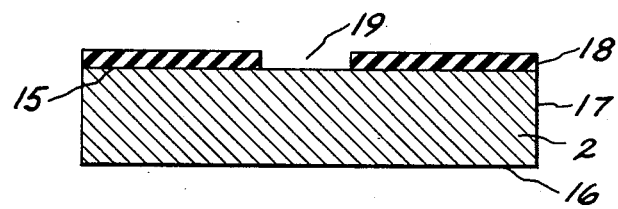
Figure 6D:
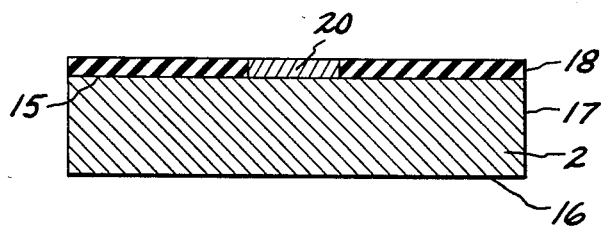
Figure 6E:
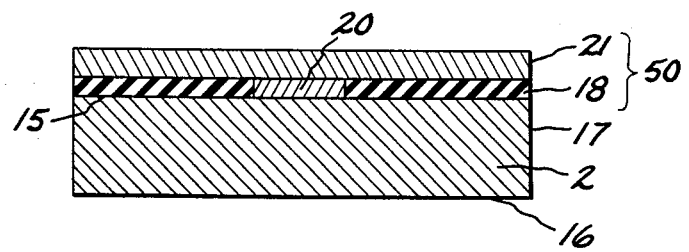

Next, as shown in FIG. 6C, at least one window 19 conforming to the configuration of the metal to be electromigrated is opened in layer 18 to expose an area of underlying surface 15. Typically, the area of underlying surface 15 exposed by window 19 will be on the order of 5-10 square microns if deposits 20 are in the form of discrete "droplets", e.g., squares or circles. If deposits 20 are in the form of rectangles or rectangular segments, i.e., "elongated droplets" or "wires", windows 19 will typically have widths of 50 microns or less as measured on surface 15. Additional information on the shapes of windows 19 and, therefore, configurations or patterns of droplets for electromigration may be obtained, for example, by reference to the above-cited and incorporated U.S. Pat. Nos. 3,899,361; 3,901,736; 3,979,230; and 3,998,662. Thereafter, as shown in FIG. 6D, the metal to be electromigrated is deposited into window 19 in contact with the material of body 2.

Where a plurality of discrete droplets 20 are to be electromigrated simultaneously or there are several discrete areas each having interconnected deposits to be electromigrated simultaneously, uniform electrical contact with the electromigrating inclusions has been found to be essential. Therefore, to complete the fabrication of a connection according to this embodiment of the invention, a first conducting medium 21 is applied over layer 18 in contact with deposit 20 as shown in FIG. 6E. Conducting regions 21 may be a metal, such as gallium, which is liquid at typical electromigration temperatures, a deposited refractory metal, or a mat of interwoven carbon fibers. If a liquid metal is used as conducting medium 21, a refractory metal layer such as a large copper sheet must first be deposited over deposit 20 to prevent the liquid metal type medium 21 from also electromigrating. In some cases, such as with gold as the electromigrating metal and gallium as conducting medium 21, an intermetallic layer forms on reaction of the Ga and Au and serves the same purpose as a refractory metal layer. Use of the carbon fiber mat as medium 21 requires that additional means (not shown) be provided to ensure good uniform electrical contact between medium 21 and deposit 20.

The combination of insulating layer 18, through which contact is made to at least one deposit 20 of a metal to be electromigrated, and conducting medium 21 constitute an anode or cathode connection 50 according to this embodiment of the invention.

Figure 7:
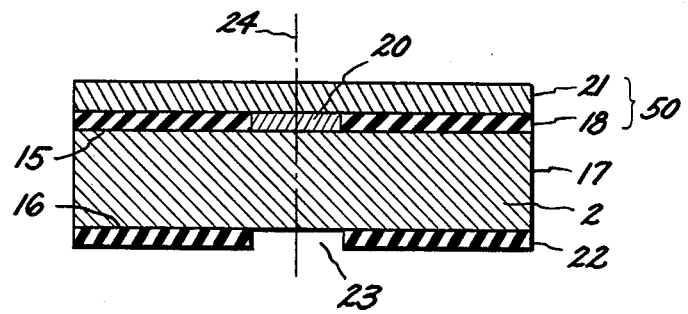
FIG. 7 shows in schematic cross-section the body of FIG. 6E after completion of an additional step in preparation for providing a second anode or cathode connection on the second major surface of the body and opposite to the first connection of FIG. 6E.
Figure 8:
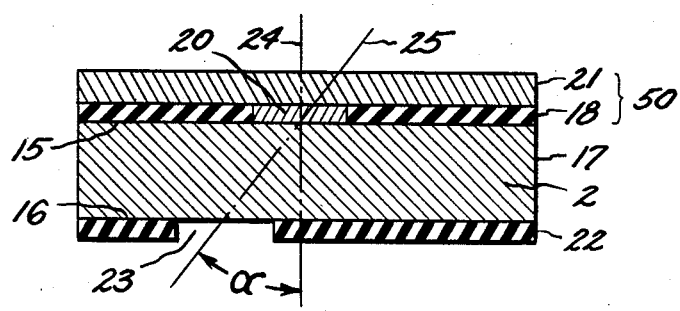
FIG. 8 shows in schematic cross-section the body of FIG. 6E after completion of an additional step in preparation for providing a second anode or cathode connection on the second major surface of the body and displaced by the angle α from the first connection of FIG. 6E.

Contact to the opposite side of body 2 may be made by placing surface 16 of body 2 in contact with a large sheet of conducting material, e.g., copper, or preferably by constructing a connection similar to that described above. If such a similar connection is made, an insulating layer 22, similar or identical to layer 18, is applied to surface 16 and at least one window 23 is opened in layer 22, as shown in FIG. 7, to expose an area of underlying surface 16. Window 23, typically and preferably has the same configuration as window 19. Window 23 may be situated opposite to deposit 20, as shown in FIG. 7, along axis 24 which extends substantially perpendicularly between surfaces 15 and 16 and substantially through the geometric center of deposit 20 (more specifically, the geometric center of the underlying area of surface 15 exposed by window 19) and the geometric center of the underlying area of surface 16 exposed by window 23. Alternatively, as is shown in FIG. 8, window 23 may be positioned in a relationship which is not opposite to deposit 20. In FIG. 8 axis 24 extends through the geometric center of deposit 20 and is substantially perpendicular to surfaces 15 and 16. Axis 25 extends through the geometric center of the underlying area of surface 23 exposed by window 23 and intersects axis 24 at the interface between deposit 20 and surface 15 forming the angle $\alpha$ with axis 24. The angle $\alpha$ is a function of the surface-to-volume ratio of the migrating liquid metal inclusion and the crystallographic direction lying most parallel to axis 25. For large inclusions, i.e. on the order of about 2 mm in diameter or largest dimension, $\alpha$ can be as large as 30°. For smaller inclusions, i.e., on the order of 0.1 mm in diameter or largest dimension, $\alpha$ can be as large as 45°.

Figure 9:
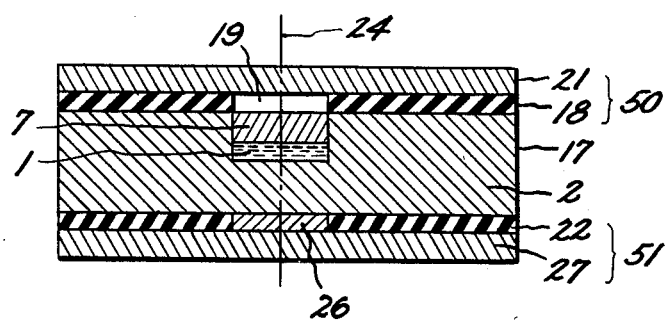
FIG. 9 shows in schematic cross-section a liquid metal inclusion electromigrating from the first major surface of a body of semiconducting material to the second major surface between anode and cathode connections, of the type made in accordance with the sequence of FIGS. 6A through 6E, on the first and second surfaces.

Deposit 26 of a conducting refractory metal, e.g., tantalum or tungsten, is next made in window 23, as shown in FIG. 9, and a second conducting layer 27 is applied over layer 22 in contact with deposit 26. This latter step completes the making of connection 51. To practice electromigration, as is taught in more detail in the referenced Ser. No. 221,142 application, a point type contact, e.g., an ohmic point contact, is made to conducting layers 21 and 27, the temperature of body 2 is increased to the preselected electromigration temperature and a direct electrical current is passed through body 2 between connections 50 and 51. As noted above, connection 50 will be either an anode or a cathode (and vice versa for connection 51) depending upon the nature of the semiconductor material of body 2 and the work function of deposit 20 in the semiconductor material of body 2.

In FIG. 9 deposit 20 has been electromigrated as liquid-metal inclusion 1 a short distance toward connection 51 forming trail 7 of recrystallized material of body 2 having solid solubility of the dopant, i.e., the metal of deposit 20, therein. As may be noted from FIG. 9, electrical contact is maintained directly with trail 7 thereby preventing, for the six cases in the Table denoted by an asterisk (*), the formation of a rectifying junction between trail 7 and the semiconductor material of body 2.

Figure 10A:
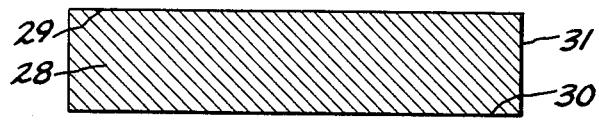
FIGS. 10A through 10C show in schematic cross-section the making of a first anode or cathode connection, particularly useful in electromigrating liquid metal inclusions at high current densities, on the first major surface of a body of semiconducting material.
Figure 10B:
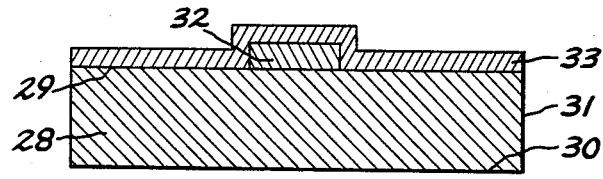
Figure 10C:
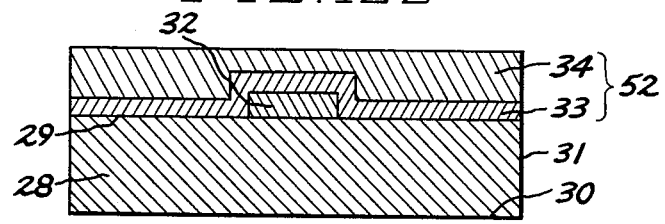

For electromigration at high current densities in thin semiconductor bodies, it is desirable to have a uniform current distribution over the face of the body in order to avoid nonuniform Joule heating which could generate thermal stresses and strains in the body. Such a uniform current distribution requires a uniformly contacted electrode over both major surfaces of the body. A novel means of making such a uniform contact is shown in FIGS. 10A through 10C. In FIG. 10A there is shown in cross-section a body 28 of semiconductor material. Body 28 has the same attributes discussed above for body 2 in conjunction with FIG. 6A. As shown in FIG. 10B, at least one deposit 32 of the metal to be electromigrated is affixed to major surface 29 of body 28 by conventional means such as electron beam deposition and photolithography. Generally a plurality of deposits in a pattern will be made as was discussed above in conjunction with the discussion of FIG. 6C.

Next, as also shown in FIG. 10B, a thin layer 33 of a refractory metal is electron beam deposited or sputtered over deposit 32 as well as the remainder of surface 19 with which deposit 32 is in contact. Finally, as shown in FIG. 10C, a layer 34 of a conducting material is applied over layer 33. Conducting layer 34 may be a metal, such as gallium, which is a liquid at typical electromigration temperatures or a carbon fiber mat. Refractory metal layer 33 remains solid at the electromigration temperature and prevents electromigration of a liquid metal conducting layer 34 while allowing the DC electrical current which drives the electromigration process to pass through unimpeded.

The combination of refractory layer 33, overlying and in contact with at least one deposit 32 of a metal to be electromigrated, and conducting layer 34 constitute an anode or cathode connection 52 according to this embodiment of the invention.

Figure 11:
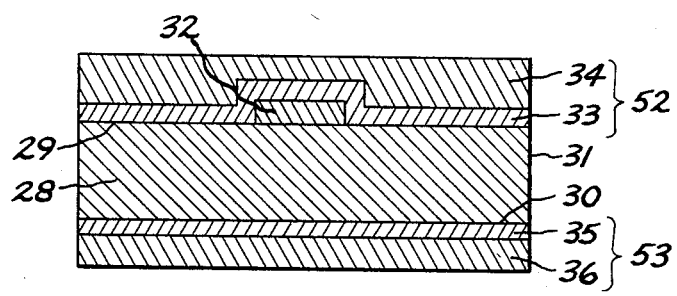
FIG. 11 shows in schematic cross-section the body of FIG. 10C after completion of a second anode or cathode connection on the second major surface of the body.

Contact to opposite major surface 30 of body 2 must also preferably provide a uniform current distribution over the entire surface and may be accomplished by placing body 2 into uniform contact with a conducting surface such as a copper plate or carbon fiber mat (not shown). Preferably for positive uniform contact with surface 30, a connection similar to connection 52 is made by electron beam depositing or sputtering a thin layer 35 of a refractory metal onto surface 30 and thereafter depositing or painting a layer 36 of a low melting point metal over layer 35 thus forming connection 53 as shown in FIG. 11. As in the case of connections formed for the practice of electromigration at low current densities, point contacts (not shown) are made to conducting layers 34 and 36.

Figure 12:
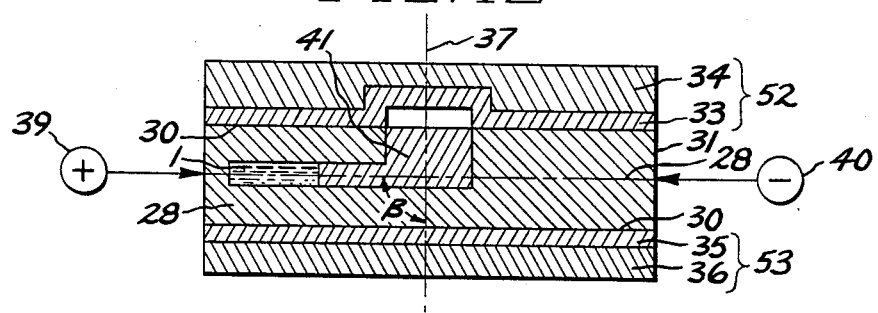
FIG. 12 shows in schematic cross-section the electromigration of a liquid metal inclusion partially into the body of FIG. 11 along a first perpendicular path between the major opposed surfaces of the body and then along a second path substantially perpendicular to the first path.

As shown in FIG. 12, there exists another embodiment of the invention particularly favorably practiced with the high current embodiment discussed above. In FIG. 12, deposit 32 was electromigrated, in accordance with the teachings of the above-referenced Ser. No. 221,142 application, as inclusion 41 a short distance into the interior of body 28 along axis 37 by applying a DC current of the proper polarity to connections 52 and 53. Thereafter, inclusion 1 was electromigrated perpendicularly to axis 37 along axis 38 by applying a DC current of the proper polarity to oppositely situated ohmic-type connections 39 and 40 in contact with outer peripheral edge area 31 which joins major surfaces 29 and 30 of body 28.

The angle between axis 37 and 38, $\beta$, is shown in FIG. 12 as 90°. By applying DC currents of the proper magnitude and polarity to connections 52 and 53 and to ohmic contacts 39 and 40, inclusion 1 may be tracked along axis 38 in a manner such that $\beta$ will not be equal to 90°, but may range from 0° to 180°.

While the invention has been particularly shown and described with reference to several preferred embodiments thereof, it will be understood by those skilled in the art that various changes in form and detail may be made therein without departing from the true spirit and scope of the invention as defined by the appended claims.

I claim as my invention:

1. A connection useful for the practice of electromigration comprising:
    (a) a layer of insulating material, said layer of insulating material being situated on and overlying a preselected major surface of a body of single crystal semiconductor material and having at least one window therethrough, said window having therein a deposit of metal to be electromigrated, said deposit being in contact with said major surface of said body, and
    (b) a layer of a conducting material situated on and overlying said layer of insulating material and being in contact with said deposit.

2. The connection of claim 1 wherein said layer of a conducting material comprises a layer of a metal having a melting temperature lower than the electromigration temperature.

3. The connection of claim 2 wherein said metal is gallium.

4. The connection of claim 1 wherein said layer of a conducting material comprises a layer of a material having a melting temperature higher than the electromigration temperature.

5. The connection of claim 4 wherein said material is a mat in the form of interwoven carbon fibers.

6. A connection useful in the practice of electromigration comprising:
    (a) a first layer of a conducting refractory metal overlying and contiguous with the first major surface of a body of single crystal semiconductor material and overlaying at least one deposit of a metal to be electromigrated, said deposit being situated on said first major surface, and
    (b) a first layer of a different conducting material overlying and contiguous with said first layer of a refractory metal.

7. The connection of claim 6 wherein said first layer of a conducting material comprises a layer of a metal having a melting temperature lower than the electromigration temperature.

8. The connection of claim 7 wherein said metal is gallium.

9. The connection of claim 6 wherein said layer of a conducting material comprises a layer of a material having a melting temperature higher than the electromigration temperature.

10. The connection of claim 9 wherein said conducting material is a mat in the form of interwoven carbon fibers.

11. Connections useful in electromigrating a liquid metal inclusion in a body of single crystal semiconductor material, said body having first and second major opposed surfaces, an outer peripheral edge area interconnecting said first and second opposed surfaces, a first preselected type conductivity, a first preselected resistivity, and a preferred crystallographic relationship between the plane of at least said first major surface and the crystallographic direction parallel to the perpendicularly measured distance between said major surfaces, said connections comprising in combination:

(a) a first connection, said first connection having a first layer of an insulating material situated on and overlying said first major surface and having at least one window therethrough, said window having therein a deposit of the metal to be electromigrated, said deposit being in contact with said first major surface, and a first layer of a different conducting material situated on and overlying said first layer of insulating material and being in contact with said deposit; and (b) a second connection, said second connection having a second layer of an insulating material situated on and overlying said second major surface and having at least one window therethrough, said window having therein a deposit of a refractory metal, said deposit of conducting refractory metal being an contact with said second major surface, and a second layer of a different conducting material situated on and overlying said second layer of an insulating material and being in contact with said deposit.

12. The connections of claim 11 further including a layer of refractory metal between said deposit of the metal to be electromigrated and said first layer of a conducting material.

13. The connections of claim 11 further including electrical contacts with said first and second layers of a conducting material.

14. The connections of claim 11 wherein said first and second layers of a conducting material comprise layers of a metal having a melting temperature lower than the electromigration temperature.

15. The connections of claim 14 wherein said metal is gallium.

16. The connections of claim 11 wherein said first and second layers of a conducting material comprise layers of a material having a melting temperature higher than the electromigration temperature.

17. The connections of claim 16 wherein said conducting material is a mat in the form of interwoven carbon fibers.

18. The connections of claim 11 wherein said window in said second layer of an insulating material has substantially the same geometric configuration as said window in said first layer of insulating material.

19. The connections of claim 18 wherein said window in said second layer of insulating material is situated substantially opposite from said window in said first layer of insulating material.

20. The connections of claim 18 wherein said window in said second layer of insulating material is situated in relationship to said window in said first layer of insulating material whereby a first axis passing substantially through the geometric center of the area of said first surface exposed by said opening of said window in said first layer of insulating material and passing substantially through the geometric center of the area of said second surface exposed by said opening of said window in said second layer of insulating material intersects and forms angle $\alpha$ with a second axis passing substantially through the geometric center of the area of said first surface exposed by said opening of said window in said first layer of insulating material and being substantially perpendicular to said major surfaces.

21. The connections of claim 20 wherein said angle $\alpha$ is less than or equal to about 45°.

22. A connection useful for the practice of electromigation comprising:

(a) a layer of insulating material, said layer of insulating material being situated on and overlying a preselected major surface of a body of single crystal semiconductor material and having at least one window therethrough, said window having therein a deposit of metal to be electromigrated, (b) a layer of refractory metal on said layer of insulating material, and (c) a layer of conducting material situated on and overlaying said layer of refractory material.

* * * * *